US012604442B2

(12) United States Patent
Frank et al.

(10) Patent No.: US 12,604,442 B2
(45) Date of Patent: Apr. 14, 2026

(54) POWER MODULE, PARTICULARLY FOR POWER ELECTRONICS OF A VEHICLE

(71) Applicant: Robert Bosch GmbH, Stuttgart (DE)

(72) Inventors: Alexander Frank, Herrenberg (DE);
Christian Egger, Stuttgart (DE);
Erdogan Dikmenli, Ludwigsburg (DE);
Marco Lorenz, Ditzingen (DE);
Samuel Vasconcelos Araujo, Esslingen
Am Necker (DE)

(73) Assignee: ROBERT BOSCH GMBH, Stuttgart
(DE)

( * ) Notice: Subject to any disclaimer, the term of this
patent is extended or adjusted under 35
U.S.C. 154(b) by 208 days.

(21) Appl. No.: 18/555,960

(22) PCT Filed: Aug. 12, 2022

(86) PCT No.: PCT/EP2022/072666
§ 371 (c)(1),
(2) Date: Oct. 18, 2023

(87) PCT Pub. No.: WO2023/046365
PCT Pub. Date: Mar. 30, 2023

(65) Prior Publication Data
US 2024/0206103 A1 Jun. 20, 2024

(30) Foreign Application Priority Data

Sep. 27, 2021 (DE) .................... 10 2021 210 770.2

(51) Int. Cl.
H05K 7/20 (2006.01)
H05K 7/14 (2006.01)
*H02M 7/00* (2006.01)

(52) U.S. Cl.
CPC ..... H05K 7/20927 (2013.01); H05K 7/14329
(2022.08); *H02M 7/003* (2013.01)

(58) Field of Classification Search
None
See application file for complete search history.

(56) References Cited

U.S. PATENT DOCUMENTS 7,465,177 B2 * 12/2008 Wood ................... H01R 13/005
439/247
7,876,561 B2 * 1/2011 Schnetzka ............... H02P 29/50
361/699

(Continued)

FOREIGN PATENT DOCUMENTS

DE 112008001410 T5 4/2010
DE 102019203399 A1 9/2020

(Continued)

OTHER PUBLICATIONS

International Search Report for PCT/EP2022/072666, Issued Dec.
8, 2022.

*Primary Examiner* — Courtney L Smith
(74) *Attorney, Agent, or Firm* — NORTON ROSE
FULBRIGHT US LLP

(57) ABSTRACT

A power module, for power electronics of a vehicle, having
two DC busbars and three phase busbars which are disposed
between the two DC busbars, and a plurality of power
semiconductors, each of which is disposed between one of
the DC busbars and one of the phase busbars, and power
electronics having at least one such power module, and a
vehicle having such power electronics. The DC busbars and
the phase busbars are electrically insulated from one another
and in each case have at least one cooling duct through
which a dielectric fluid flows, at both open ends each of the
DC busbars and the phase busbars having at least one
plug-in electrical contact connection and at least one plug-in
fluid connection that in each case form a combined plug-in
(Continued)

connection, so that multiple power modules are connectable to each other in fluid-tight fashion using plug connections.

14 Claims, 6 Drawing Sheets

(56)                    References Cited

U.S. PATENT DOCUMENTS

| | | | | |
|---|---|---|---|---|
| 8,760,855 | B2 * | 6/2014 | Howes ............... | H05K 7/20936 |
| | | | | 361/677 |
| 11,224,147 | B1 * | 1/2022 | Yen .................... | H05K 7/20909 |
| 11,849,569 | B2 * | 12/2023 | Zhou ................. | H05K 7/20254 |
| 2005/0088835 | A9 * | 4/2005 | Beihoff ............. | H05K 7/20927 |
| | | | | 361/818 |
| 2019/0394907 | A1 * | 12/2019 | Pradeepkumar ... | H05K 7/20927 |
| 2021/0144888 | A1 * | 5/2021 | Sano .................... | H01L 25/115 |

FOREIGN PATENT DOCUMENTS

| | | | |
|---|---|---|---|
| DE | 102019111111 | A1 | 11/2020 |
| JP | 2004364427 | A | 12/2004 |
| JP | 2007215396 | A | 8/2007 |
| JP | 2011258632 | A | 12/2011 |
| JP | 2013123040 | A | 6/2013 |
| WO | 2016026514 | A1 | 2/2016 |

* cited by examiner

POWER MODULE, PARTICULARLY FOR POWER ELECTRONICS OF A VEHICLE

FIELD

The present invention relates to a power module, particularly for power electronics of a vehicle. Power electronics for a vehicle having such a power module, and a vehicle having such power electronics are also subject matters of the present invention.

BACKGROUND INFORMATION

Power semiconductors in power electronics for vehicles having an electric drive or hybrid drive carry high electric currents. The heat losses caused by conduction and switching losses, which must be dissipated over a very small surface, lead to heat flow densities of up to 1000 W/cm². For efficient cooling, the power substrates that support the power semiconductors are usually cooled by coolers which carry liquid coolant. In so doing, the heat is transferred between the semiconductors to be cooled and the heat-transferring surface (contact surface cooler-coolant) solely by heat conduction. In that context, the maximum permissible semiconductor temperature is critical in terms of failure, which is why minimizing the thermal resistance between the semiconductor and the coolant is advantageous. This is achieved, inter alia, by distributing the heat loss occurring at the semiconductors over a larger surface by heat conduction. Part of the layer structure through which the heat is conducted, what is referred to as the thermal stack, is a dielectric (e.g., a ceramic or a polymer), in order to galvanically isolate the coolant from the current-carrying components (power semiconductors and current conduction).

German Patent Application No. DE 10 2019 203 399 A1 describes an electric busbar system having a first, second and third busbar which in each case are able to be electrically energized and are electrically insulated from one another. Each of these three busbars is formed as a fluid passage through which a fluid is able to flow, so that the three busbars form a first, second, and third fluid passage. In this case, the busbar system includes a deflection distributor for distributing the fluid to the second and third fluid passage after it has passed through the first fluid passage. An alternating electric current flows through the first busbar and a direct electric current flows through the second and third busbar. The first busbar is subdivided by at least one electrical insulation into a first and at least one second busbar section, so that the at least two busbar sections are electrically insulated from each other. In addition, the electric busbar system has at least one electronic circuit configuration which includes multiple semiconductor switches and is connected electrically to the first, second and third busbar. For example, such a circuit configuration may be an electric inverter or power inverter.

SUMMARY

A power module, and power electronics, and a vehicle having features of the present invention may each have the advantage that the thermal resistance of the individual power modules may be improved significantly by the use of a dielectric fluid. The use of the dielectric fluid makes it possible to dispense with the ceramic layer for the electrical insulation between the charge carriers and the coolant. The design may thus be made smaller and the thermal resistance may be reduced considerably, especially in light of the poor heat conduction properties of this layer. For instance, special coolants or transmission oils may be used as dielectric fluid.

Specific embodiments of the present invention make it possible to realize power modules with considerably higher power density and compact construction volume. According to an example embodiment of the present invention, this is rendered possible by a considerable reduction of up to 50% of the thermal resistance in comparison to a conventional coolant-cooled design having an insulating ceramic layer. Thus, either the chip surface of the individual power semiconductors may be reduced (35%-40%) as well as the costs associated with that, or the operating temperature may be lowered and the losses reduced. In addition, specific embodiments of the present invention allow modularization of the power-electronics design. In this case, the individual power modules represent stand-alone individual segments of the power electronics. Due to the plug-in fluid connections in combination with the plug-in electrical contact connections, the individual power modules may be interconnected simply by plugging them together, thus permitting scaling of the power class. When using the power electronics as an inverter, the individual power modules represent stand-alone inverter segments, so that because of the compact design of the power module and cooler, the commutation cells able to be realized may be disposed flexibly in a power inverter (DC/AC converter).

Moreover, according to an example embodiment of the present invention, due to the combination of power electronics cooled by the dielectric fluid and an electric drive and/or transmission cooled by the dielectric fluid, it is possible to dispense with coolant such as water/glycol in an electric powered axle. For example, the dielectric fluid is re-cooled by an air-cooled heat exchanger. In addition, the very small construction and the modular design of the power electronics permit miniaturization and power scaling.

Specific embodiments of the present invention provide a power module, particularly for power electronics of a vehicle, which includes two DC busbars and three phase busbars that are disposed between the two DC busbars, and a plurality of power semiconductors, each of which is situated between one of the DC busbars and one of the phase busbars. The DC busbars and the phase busbars are electrically insulated from one another and in each case have at least one cooling duct through which a dielectric fluid flows. At both open ends, each of the DC busbars and the phase busbars here has at least one plug-in electrical contact connection and at least one plug-in fluid connection, which in each instance form a combined plug-in connection, so that multiple power modules are connectable to each other in fluid-tight fashion with the aid of the combined plug-in connections.

Due to the combined plug-in connections, when connecting multiple power modules, the fluid connections between the corresponding cooling ducts and the electrical connections between the corresponding DC busbars and phase busbars may be realized in one operation. The implementation as fluid-tight plug-in connections makes it possible to avoid a sharp cross-sectional narrowing of the cooling ducts, which would lead to a great loss of pressure. Moreover, the electrical connections may be realized with a sufficiently large contact surface.

In addition, according to an example embodiment of the present invention, power electronics are proposed for a vehicle, having an evaluation and control unit and at least one such power module. In this case, control-signal connections of the power semiconductors are connected electrically to the evaluation and control unit.

Furthermore, according to an example embodiment of the present invention, a vehicle is provided having such power electronics and a cooling circuit in which a dielectric fluid is conducted for cooling vehicle assemblies. In this case, the power electronics are in fluid connection with the cooling circuit via corresponding interface units.

In the present case, the evaluation and control unit may be understood to be an electrical device such as a control device, particularly a drive control device, which processes and evaluates detected sensor signals in order to adjust or regulate corresponding phase currents. The evaluation and control unit may have at least one interface which may be realized in hardware and/or software. If realized in hardware, the interfaces may be part of what is referred to as a system ASIC, for example, that includes a wide variety of functions of the evaluation and control unit. However, it is also possible for the interfaces to be separate integrated circuits or to be made up at least partially of discrete components. If realized in software, the interfaces may be software modules which are available in a microcontroller, for example, in addition to other software modules. Also advantageous is a computer-program product having program code which is stored on a machine-readable carrier such as a semiconductor memory, a hard disk memory or an optical memory and is used to carry out the evaluation when the program is executed by the evaluation and control unit.

Advantageous improvements of the power module according to the present invention and the power electronics according to the present invention are made possible by the measures and further developments disclosed herein.

In advantageous development of the power module of the present invention, the individual power semiconductors may be implemented as semiconductor switches. In this case, a first power connection of the power semiconductors may be connected in each instance directly to a corresponding DC busbar and a second power connection of the power semiconductors may be connected via a spacer to a corresponding phase busbar. This good thermal connection between the power semiconductors and the cooling ducts makes it possible to reduce the chip surface of the power semiconductors or to lower the operating temperature.

In a further advantageous refinement of the power module of the present invention, in each case the DC busbars may have three cooling ducts, which in each instance may run parallel to the cooling ducts of the three phase busbars. It is particularly advantageous that a first power semiconductor may be disposed between a first cooling duct of a first DC busbar and the cooling duct of a first phase busbar. A second power semiconductor may be disposed between a first cooling duct of a second DC busbar and the cooling duct of the first phase busbar. A third power semiconductor may be disposed between a second cooling duct of the first DC busbar and the cooling duct of a second phase busbar. A fourth power semiconductor may be disposed between a second cooling duct of the second DC busbar and the cooling duct of the second phase busbar. A fifth power semiconductor may be disposed between a third cooling duct of the first DC busbar and the cooling duct of a third phase busbar. A sixth power semiconductor may be disposed between a third cooling duct of the second DC busbar and the cooling duct of the third phase busbar. Since the cooling ducts of the phase busbars dissipate heat losses from power semiconductors on both sides of the phase busbars, and the cooling ducts of the DC busbars have a thermal load only on one side, the height of the cooling ducts of the phase busbars may be greater than the height of the cooling ducts of the DC busbars. Preferably, the cooling ducts of the phase busbars may be twice as high as the duct height of the DC busbars. As homogeneous a temperature profile as possible may thus be achieved.

In a further advantageous development of the power module of the present invention, the individual cooling ducts may each have a cooling geometry in the area of the power semiconductors. For example, the cooling geometry may include multiple cooling pins or turbulators or projections or ribs. The cooling geometry makes it possible to achieve a uniform distribution of the dielectric fluid in relation to the duct height and thus better transfer of heat. In this connection, the dimensions and spacings of the cooling pins or turbulators or projections or ribs may be identical in all ducts, in order to achieve an identical pressure-loss characteristic.

In another advantageous development of the power module of the present invention, the DC busbars and the phase busbars may be surrounded by a casing, while leaving the plug-in fluid connections and the plug-in electrical contact connections free. For example, the power module may be cast in a transfer-molding process using a transfer mold. So that no molding material is able to flow into the cooling ducts, the fluid connections may be closed prior to the transfer-molding process. After the transfer-molding process, the covering layer may be removed by milling, for example.

In further advantageous development of the power module of the present invention, capacitor connections may be disposed laterally on the DC busbars, led out of the casing and contacted with capacitors, so that the individual capacitors in each case are located electrically between the two DC busbars. In addition, control-signal connections of the power semiconductors may be led out laterally from the casing and are able to be contacted with an evaluation and control unit. For example, the control-signal connections may be implemented as lead frames. In order to simplify the transfer-molding process, the laterally disposed capacitor connections and the laterally disposed control-signal connections may be situated in one common connection plane, enabling the mold to be closed. In addition, the capacitors may be cast separately with a casing, and after the transfer molding and the opening of the cooling ducts, be connected to the capacitor connections of the power module. Due to this process sequence, the components may be checked separately in the production process. The capacitors are also cooled via the capacitor connections with the aid of heat conduction through the integrated cooling duct of the DC busbar.

In a further advantageous refinement of the power module of the present invention, the DC busbars and the phase busbars may be realized as 3D-printed components or as punched/bent parts. A printable metal such as copper (Cu) or copper graphite (Cu—C), for instance, is used for the DC busbars and the phase busbars. For example, the power semiconductors may be connected to the surface of the DC busbars or to the surface of the spacers by sintering or soldering. The surface of the phase busbars may be connected to the spacers by sintering, for instance. The spacers may be produced preferably from copper. A 3D-printing method is to be understood as a method having an application process and a hardening process, e.g., selective laser sintering, selective electron beam melting or stereolithography.

In advantageous development of the power electronics of the present invention, multiple power modules, each of which forms an inverter segment, may be connected to each other by plug-in connections and form one overall inverter having a higher power density. In this case, each inverter segment may form a complete B6 bridge and, together with the evaluation and control unit and the capacitors, represent a complete inverter. In this context, each phase busbar of the individual inverter segments includes a semiconductor switch implemented as a field-effect transistor for a "high side" and a semiconductor switch implemented as a field-effect transistor for a "low side". The evaluation and control unit may be mounted on the casing of the assembled power electronics.

Exemplary embodiments of the present invention are represented in the figures and explained in greater detail in the following description. In the figures, identical reference numerals denote components or elements which perform the same or analogous functions.

DETAILED DESCRIPTION OF EXAMPLE EMBODIMENTS

Figure 1:
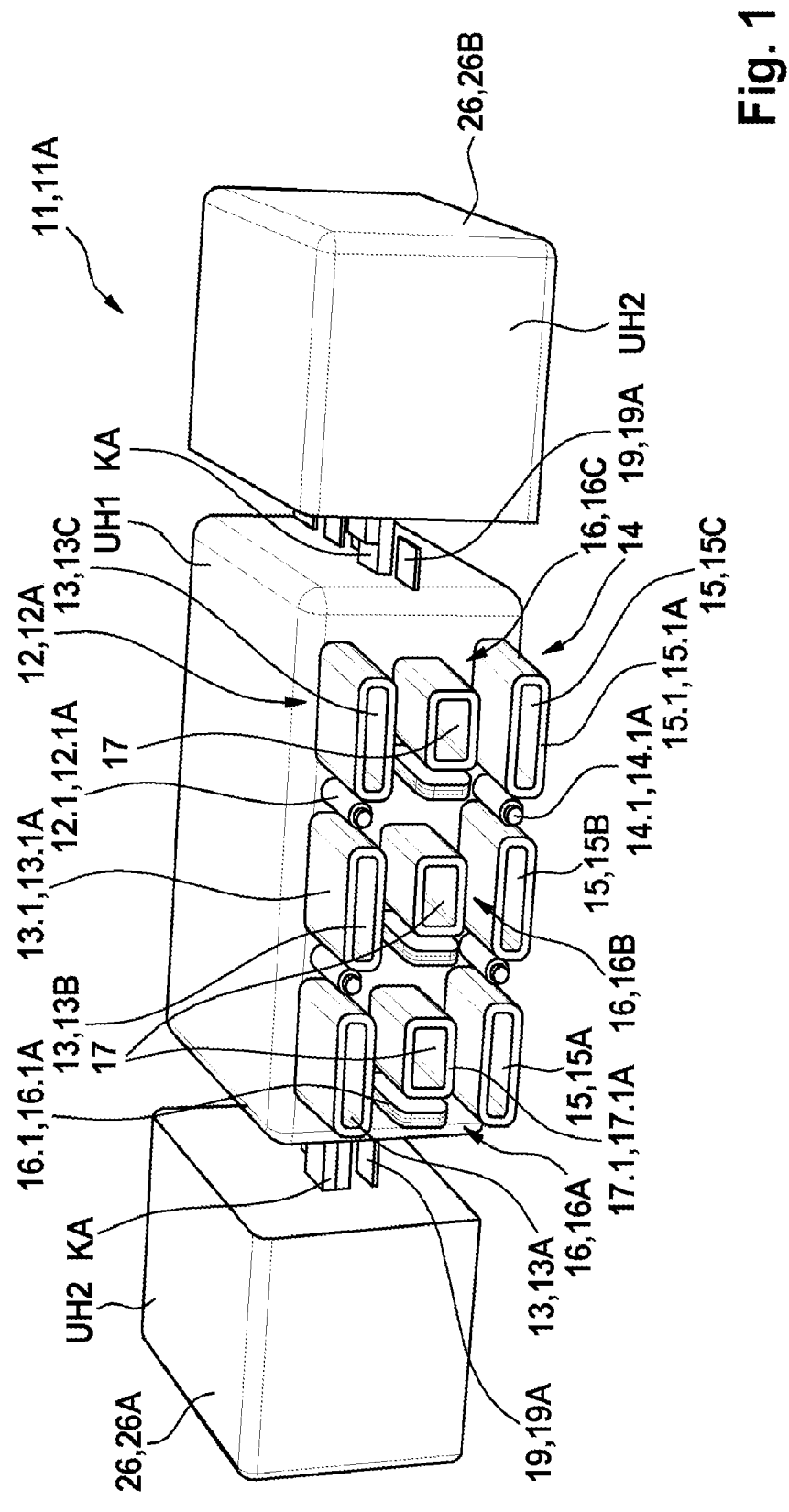
FIG. 1 shows a schematic perspective representation of an exemplary embodiment of a power module according to the present invention from the front.

As evident from FIGS. 1 to 6, the exemplary embodiment of a power module 11, 11A, 11B, 11C according to the present invention shown, especially for power electronics 10 of a vehicle 1, includes two DC busbars 12, 12A, 12B, 12C, 14, 14A, 14B, 14C and three phase busbars 16, 16A, 16B, 16C, which are disposed between the two DC busbars 12, 12A, 12B, 12C, 14, 14A, 14B, 14C, and a plurality of power semiconductors 18, 18A, 18B, 18C, 18D, 18E, 18F, each of which is located between one of DC busbars 12, 12A, 12B, 12C, 14, 14A, 14B, 14C and one of phase busbars 16, 16A, 16B, 16C. DC busbars 12, 12A, 12B, 12C, 14, 14A, 14B, 14C and phase busbars 16, 16A, 16B, 16C are electrically insulated from each other and in each case have at least one cooling duct 13, 13A, 13B, 13C, 15, 15A, 15B, 15C, 17 through which a dielectric fluid flows. At both open ends, DC busbars 12, 12A, 12B, 12C, 14, 14A, 14B, 14C and phase busbars 16, 16A, 16B, 16C each have at least one plug-in electrical contact connection 12.1, 14.1, 16.1 and at least one plug-in fluid connection 13.1, 15.1, 17.1, which in each case form a combined plug-in connection, so that multiple power modules 11, 11A, 11B, 11C are connectable to each other in fluid-tight fashion with the aid of plug-in connections.

In the exemplary embodiment shown, power module 11, 11A, 11B, 11C is implemented as a complete B6 bridge and includes six power semiconductors 18, 18A, 18B, 18C, 18D, 18E, 18F in the form of semiconductor switches or field-effect transistors. In this context, a first power connection of power semiconductors 18, 18A, 18B, 18C, 18D, 18E, 18F is connected in each instance directly to a corresponding DC busbar 12, 12A, 12B, 12C, 14, 14A, 14B, 14C, and a second power connection of power semiconductors 18, 18A, 18B, 18C, 18D, 18E, 18F is connected via a spacer to a corresponding phase busbar 16, 16A, 16B, 16C. In the exemplary embodiment shown, the spacers are made of copper. Power semiconductors 18, 18A, 18B, 18C, 18D, 18E, 18 in the exemplary embodiment shown are connected to DC busbars 12, 12A, 12B, 12C, 14, 14A, 14B, 14C and to the spacers with the aid of sintering. In an alternative exemplary embodiment not shown, power semiconductors 18, 18A, 18B, 18C, 18D, 18E, 18 are soldered onto DC busbars 12, 12A, 12B, 12C, 14, 14A, 14B, 14C and the spacers. Phase busbars 16, 16A, 16B, 16C are connected to the copper spacers on both sides by sintering.

As also evident from FIGS. 1 to 5, in each case the two DC busbars 12, 12A, 12B, 12C, 14, 14A, 14B, 14C have three cooling ducts 13, 13A, 13B, 13C, 15, 15A, 15B, 15C, 17, each of which runs parallel to cooling ducts 17 of the three phase busbars 16, 16A, 16B, 16C. As evident particularly from FIG. 2, in the exemplary embodiment of power module 11, 11A, 11B, 11C shown, a first power semiconductor 18A is disposed between a first cooling duct 13A of a first DC busbar 12 and cooling duct 17 of a first phase busbar 16A. A second power semiconductor 18B is disposed between a first cooling duct 15A of a second DC busbar 14 and cooling duct 17 of first phase busbar 16A. A third power semiconductor 18C is disposed between a second cooling duct 13B of first DC busbar 12 and cooling duct 17 of a second phase busbar 16B. A fourth power semiconductor 18D is disposed between a second cooling duct 15B of second DC busbar 14 and cooling duct 17 of second phase busbar 16A. A fifth power semiconductor 18E is disposed between a third cooling duct 13C of first DC busbar 12 and cooling duct 17 of a third phase busbar 16C. A sixth power semiconductor 18F is disposed between a third cooling duct 15C of second DC busbar 14 and cooling duct 17 of third phase busbar 16C.

Figure 2:
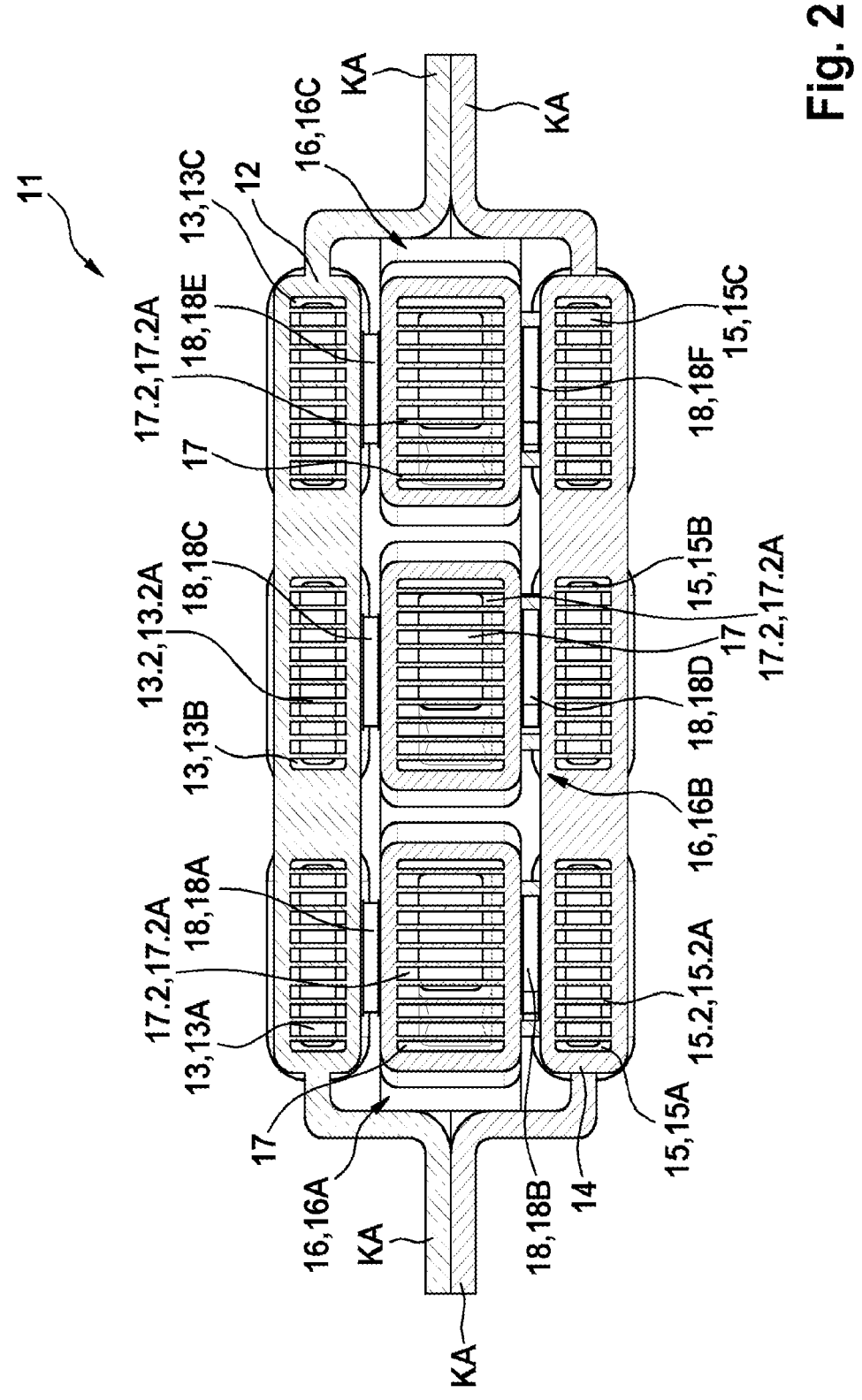
FIG. 2 shows a schematic sectional view of the power module according to the present invention from FIG. 1 without casing and capacitors.
Figure 3:
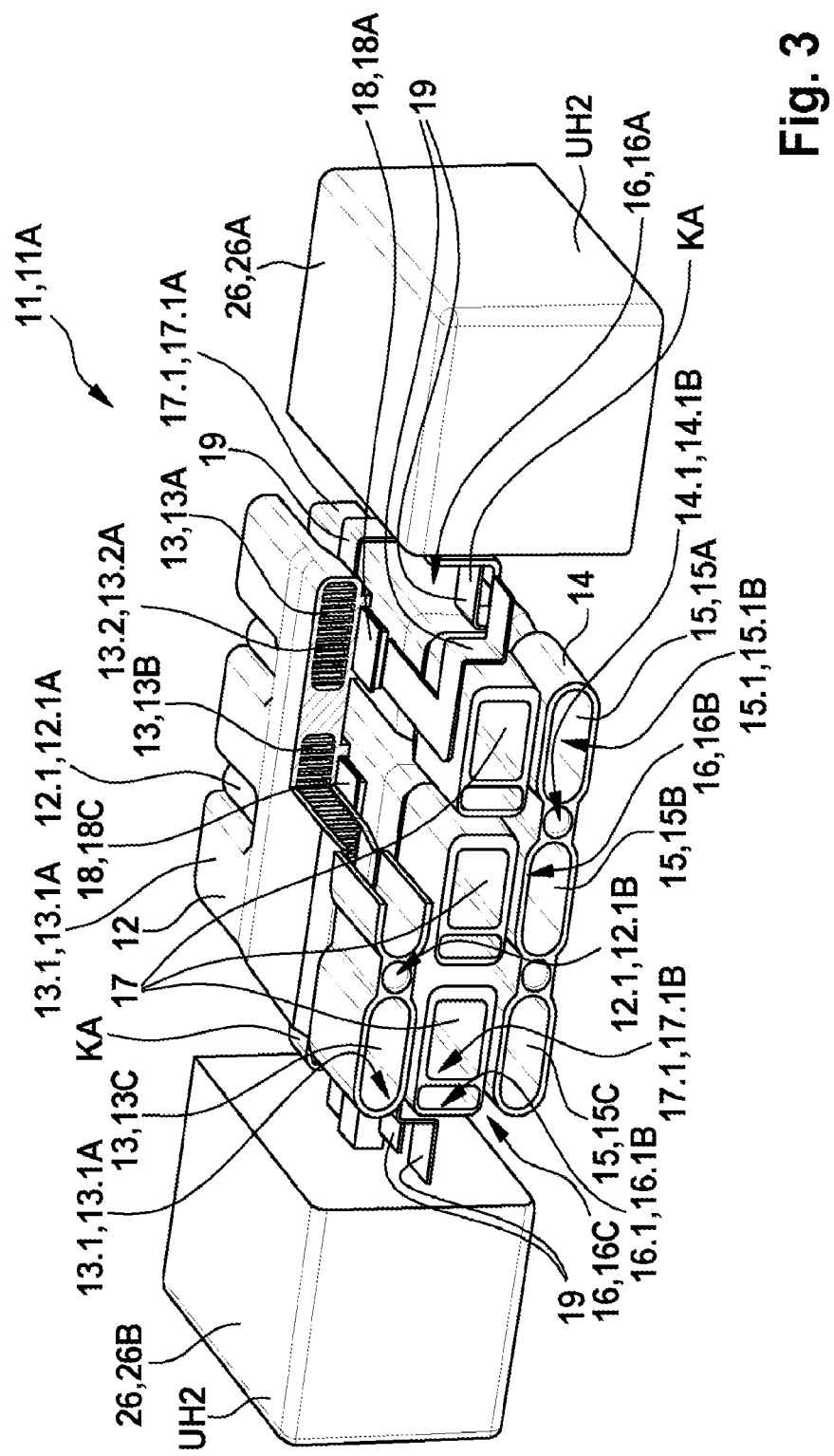
FIG. 3 shows a schematic perspective representation of the power module according to the present invention from FIG. 1 from the back.
Figure 4:
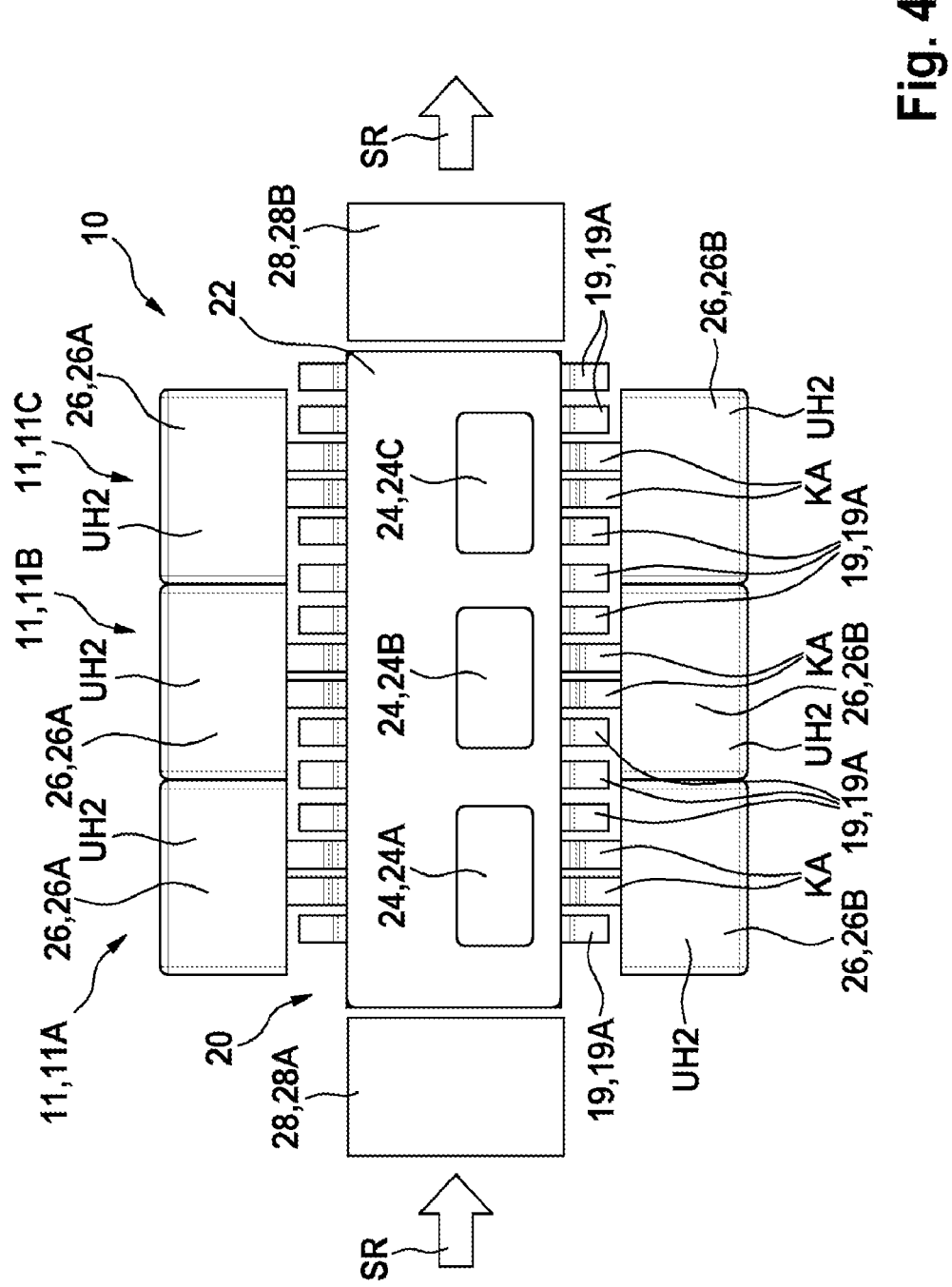
FIG. 4 shows a schematic plan view of an exemplary embodiment of power electronics according to the present invention having three power modules from FIGS. 1 to 3.
Figure 5:
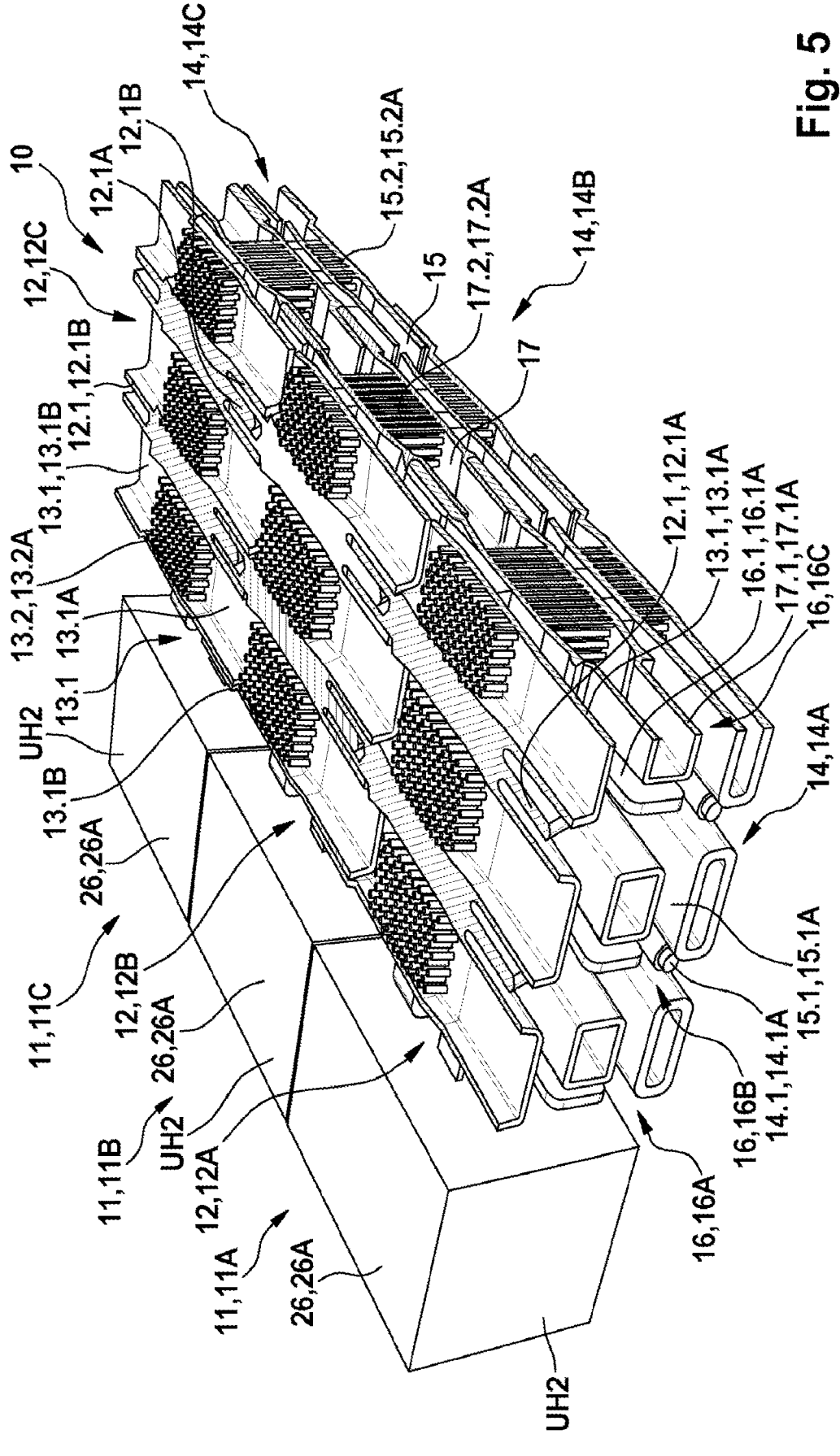
FIG. 5 shows a schematic perspective partial sectional representation of a segment of the power electronics according to the present invention from FIG. 4.

As apparent particularly from FIGS. 2, 3 and 5, individual cooling ducts 13, 13A, 13B, 13C, 15, 15A, 15B, 15C, 17 in each case have a cooling geometry 17.1 in the area of power semiconductors 18, 18A, 18B, 18C, 18D, 18E, 18F. In the exemplary embodiment shown, cooling geometry 17.1 includes multiple cooling pins 17.1A, also referred to as pin fins. In alternative exemplary embodiments of cooling ducts 13, 13A, 13B, 13C, 15, 15A, 15B, 15C, 17 not shown, cooling geometry 17.1 may include turbulators or projections or ribs. As also evident from FIGS. 1 to 5, the height of cooling ducts 17 of phase busbars 16, 16A, 16B, 16C is twice that of cooling ducts 13, 13A, 13B, 13C, 15, 15A, 15B, 15C of DC busbars 12, 12A, 12B, 12C, 14, 14A, 14B, 14C, since the heat loss of power semiconductors 18, 18A, 18B, 18C, 18D, 18E, 18F is dissipated from power semiconductors on both sides of cooling ducts 17 of phase busbars 16, 16A, 16B, 16C. Cooling ducts 13, 13A, 13B, 13C, 15, 15A, 15B, 15C of DC busbars 12, 12A, 12B, 12C, 14, 14A, 14B, 14C have a thermal load on only one side. The diameters and spacings of cooling pins 17.1A are identical in all cooling ducts 13, 13A, 13B, 13C, 15, 15A, 15B, 15C, 17.

As further evident from FIG. 1, DC busbars 12, 12A, 14, 14A and phase busbars 16, 16A, 16B, 16C are surrounded by a casing UH1, while leaving plug-in fluid connections 13.1, 15.1, 17.1 and plug-in electrical contact connections 12.1, 14.1, 16.1 free. As also apparent from FIG. 1, on the illustrated front side of power module 11, 11A, plug-in fluid connections 13.1, 15.1, 17.1 are realized as plug contacts 13.1A, 15.1A, 17.1A. Analogously, plug-in electrical contact connections 12.1, 14.1, 16.1 are likewise realized as plug contacts 12.1A, 14.1A, 16.1A. On the back side of power module 11, 11A, 11B, 11C, plug-in fluid connections 13.1, 15.1, 17.1 are realized as plug sockets 13.1B, 15.1B, 17.1B. Plug sockets 13.1B, 15.1B, 17.1B of plug-in fluid connections 13.1, 15.1, 17.1 on the back side of power module 11, 11A and plug contacts 12.1A, 14.1A, 16.1A of plug-in fluid connections 13.1, 15.1, 17.1 on the front side of power module 11, 11A are implemented and matched to each other in such a way that between two power modules 11, 11A, 11B, 11C connected to each other, fluid-tight plug-in connections are formed between plug contacts 13.1A, 15.1A, 17.1A and plug sockets 13.1B, 15.1B, 17.1B of cooling ducts 13, 13A, 13B, 13C, 15, 15A, 15B, 15C, 17. Analogously, plug-in electrical contact connections 12.1, 14.1, 16.1 on the back side of power module 11, 11A are likewise realized as plug sockets 12.1B, 14.1B, 16.1B. Plug sockets 12.1B, 14.1B, 16.1B of plug-in electrical contact connections 12.1, 14.1, 16.1 on the back side of power module 11, 11A and plug contacts 12.1A, 14.1A, 16.1A of plug-in electrical contact connections 12.1, 14.1, 16.1 on the front side of power module 11, 11A are implemented and matched to each other in such a way that between two power modules 11, 11A, 11B, 11C connected to each other, plug-in connections having the smallest possible ohmic contact resistance are formed between plug contacts 12.1A, 14.1A, 16.1A and plug sockets 12.1B, 14.1B, 16.1B of DC busbars 12, 12A, 12B, 12C, 14, 14A, 14B, 14C and phase busbars 16, 16A, 16B, 16C.

As also apparent from FIGS. 1 to 3, capacitor connections KA are disposed laterally on DC busbars 12, 12A, 14, 14A, led out from casing UH1 and contacted with capacitors 26, 26A, 26B, so that individual capacitors 26, 26A, 26B are each located electrically between the two DC busbars 12, 12A, 14, 14A. In addition, control-signal connections 19 of power semiconductors 18, 18A, 18B, 18C, 18D, 18E, 18F are led out laterally from casing UH1 and are able to be contacted with an evaluation and control unit 20 shown in FIG. 4. Laterally disposed capacitor connections KA and laterally disposed control-signal connections 19 are situated in one common connection plane. Casing UH1 is cast in a transfer-molding process with a transfer mold. Fluid connections 13.1, 15.1, 17.1 are closed prior to the transfer-molding process, so that no molding material is able to flow into corresponding cooling ducts 13, 13A, 13B, 13C, 15, 15A, 15B, 15C, 17. After the transfer-molding process, the covering layer is removed. After the transfer molding process and the opening of cooling ducts 13, 13A, 13B, 13C, 15, 15A, 15B, 15C, 17, capacitors 26, 26A, 26B, cast separately with their own casing UH2, are connected to capacitor connections KA. Because of the heat conduction, capacitors 26, 26A, 26B are also cooled via capacitor connections KA and DC busbars 12, 12A, 12B, 12C, 14, 14A, 14B, 14C. In the exemplary embodiment of power module 11, 11A shown, DC busbars 12, 12A, 12B, 12C, 14, 14A, 14B, 14C and phase busbars 16, 16A, 16B, 16C are in each case implemented from copper as 3D-printed parts. Naturally, other printable, thermally and electrically conductive materials may also be used to produce DC busbars 12, 12A, 12B, 12C, 14, 14A, 14B, 14C and phase busbars 16, 16A, 16B, 16C. In addition, DC busbars 12, 12A, 12B, 12C, 14, 14A, 14B, 14C and phase busbars 16, 16A, 16B, 16C may also be produced as punched/bent parts from a sheet metal.

As further evident from FIGS. 4 and 5, the exemplary embodiment of power electronics 10 according to the present invention shown for a vehicle 1 includes an evaluation and control unit 20 and three power modules 11A, 11B, 11C, described above, which are in fluid and electrical connection with each other via combined plug connections. Evaluation and control unit 20 is mounted on precast and assembled power electronics 10.

As further apparent from FIGS. 4 and 5, plug-in electrical contact connections 12.1, 14.1, 16.1 and plug-in electrical contact connections 12.1, 14.1, 16.1 on the front side of a first power module 11A are connected to an interface unit 28 realized as input interface 28A. Plug-in electrical contact connections 12.1, 14.1, 16.1 and plug-in electrical contact connections 12.1, 14.1, 16.1 on the back side of first power module 11A are connected to plug-in electrical contact connections 12.1, 14.1, 16.1 and plug-in electrical contact connections 12.1, 14.1, 16.1 on the front side of a second power module 11B. Plug-in electrical contact connections 12.1, 14.1, 16.1 and plug-in electrical contact connections 12.1, 14.1, 16.1 on the back side of second power module 11B are connected to plug-in electrical contact connections 12.1, 14.1, 16.1 and plug-in electrical contact connections 12.1, 14.1, 16.1 on the front side of a third power module 11C. Plug-in electrical contact connections 12.1, 14.1, 16.1 and plug-in electrical contact connections 12.1, 14.1, 16.1 on the back side of third power module 11A are connected to an interface unit 28 realized as output interface 28B.

Figure 6:
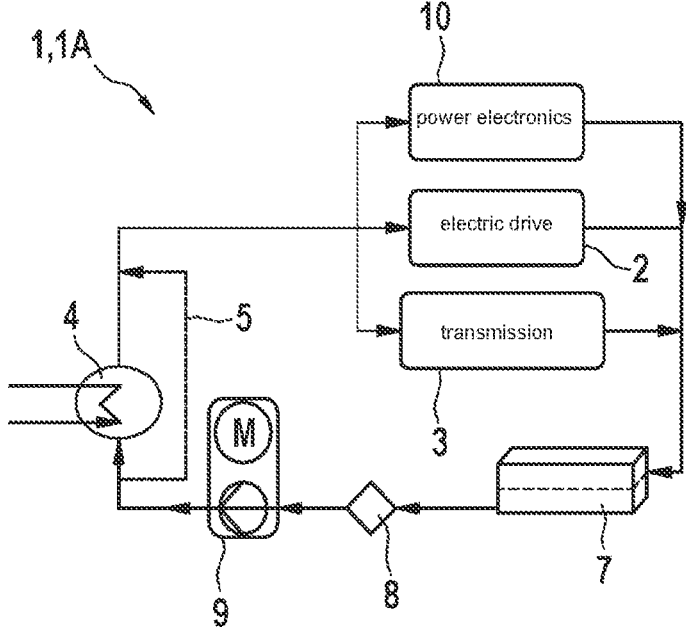
FIG. 6 shows a schematic representation of an exemplary embodiment of a cooling circuit for a vehicle according to the present invention having the power electronics from FIGS. 4 and 5.

Input interface 28A and/or output interface 28B include (s) a DC link (not further shown) of DC busbars 12, 12A, 12B, 12C, 14, 14A, 14B, 14C, and means (not further shown) for linking cooling ducts 13, 13A, 13B, 13C, 15, 15A, 15B, 15C, 17 to a cooling circuit 1A, shown in FIG. 6, of vehicle 1, in which the dielectric fluid flows in flow direction SR indicated by arrows. In this case, a first DC busbar 12A of first power module 11A and/or a first DC busbar 12C of third power module 11C is/are connected to a positive pole of a DC source (not shown). A second DC busbar 14A of first power module 11A and/or a second DC busbar 14C of the third power module is/are connected to a negative pole of the DC source. Moreover, alternating signals of the three phase busbars 16A, 16B, 16C are able to be tapped through the input interface. In addition, first DC busbar 12A of first power module 11A is connected via plug-in electrical contact connections 12.1 and plug-in fluid connections 13.1 to first DC busbar 12B of second power module 11B. First DC busbar 12B of second power module 11B is connected via plug-in electrical contact connections 12.1 and plug-in fluid connections 13.1 to first DC busbar 12C of third power module 11C. Second DC busbar 14A of first power module 11A is connected via plug-in electrical contact connections 14.1 and plug-in fluid connections 15.1 to second DC busbar 14B of second power module 11B. Second DC busbar 14B of second power module 11B is connected via plug-in electrical contact connections 14.1 and plug-in fluid connections 15.1 to second DC busbar 14C of third power module 11C. First phase busbar 16A of first power module 11A is connected via plug-in electrical contact connections 16.1 and plug-in fluid connections 17.1 to first phase busbar 16A of second power module 11B. First phase busbar 16A of second power module 11B is connected via plug-in electrical contact connections 16.1 and plug-in fluid connections 17.1 to first phase busbar 16A of third power module 11C. Second phase busbar 16B of first power module 11A is connected via plug-in electrical contact connections 16.1 and plug-in fluid connections 17.1 to second phase busbar 16B of second power module 11B.

Second phase busbar 16B of second power module 11B is connected via plug-in electrical contact connections 16.1 and plug-in fluid connections 17.1 to second phase busbar 16B of third power module 11C. Third phase busbar 16C of first power module 11A is connected via plug-in electrical contact connections 16.1 and plug-in fluid connections 17.1 to third phase busbar 16C of second power module 11B. Third phase busbar 16C of second power module 11B is connected via plug-in electrical contact connections 16.1 and plug-in fluid connections 17.1 to third phase busbar 16C of third power module 11C.

As also evident from FIG. 4, control-signal connections 19 of power semiconductors 18, 18A, 18B, 18C, 18D, 18E, 18F are connected electrically to evaluation and control unit 20. The three power modules 11A, 11B, 11C in each case form a complete B6 bridge or one inverter segment, and together with evaluation and control unit 20 and capacitors 26, 26A, 26B, represent a complete inverter. The three power modules 11A, 11B, 11C in each case represent one inverter segment, each having 40 kW power consumption. Thus, the overall inverter has a power consumption of 120 KW. As further apparent from FIG. 4, evaluation and control unit 20 includes a circuit carrier 22 having three integrated circuits 24, which in each case are realized as application-specific integrated circuits 24A, 24B, 24C. Circuit carrier 24 offers additional possibilities for the placement of an EMV filter, not shown, at the DC input. The number of integrated circuits 24 is variable, depending on the number of power modules 11A, 11B, 11C or inverter segments plugged together.

As may be seen from FIG. 6, the exemplary embodiment of a vehicle 1 shown includes power electronics 10 that correspond, e.g., to power electronics 10 described above having three power modules 11, 11A, 11B, 11C, and a cooling circuit 1A in which a dielectric fluid is conducted for cooling vehicle assemblies. Power electronics 10 are in fluid connection with cooling circuit 1A via corresponding interface units 28. In order to realize an electric powered axle cooled completely by a dielectric fluid, parallel to power electronics 10, an electric drive 2 and a transmission 3 are in fluid connection with cooling circuit 1A. Downstream of the components to be cooled, the dielectric fluid is collected in a fluid collection tank 7 and subsequently sucked through a fluid filter 8 by a fluid pump 9. Downstream of fluid pump 9, the dielectric fluid is cooled in a heat exchanger 4, e.g., by a water/glycol mixture. For targeted temperature control of the dielectric fluid, a bypass 7, represented by a dotted line, for heat exchanger 4 is also possible.

What is claimed is:

1. A power module for power electronics of a vehicle, wherein multiple power modules are provided, comprising:

two DC busbars;

three phase busbars which are disposed between the two DC busbars; and a plurality of power semiconductors, each of which is disposed between one of the DC busbars and one of the phase busbars;

wherein the DC busbars and the phase busbars are electrically insulated from one another, and each has at least one cooling duct through which a dielectric fluid flows;

wherein, at both open ends of each of the respective busbars, each of the DC busbars and the phase busbars has at least one plug-in electrical contact connection and at least one plug-in fluid connection which in each instance form a combined plug-in connection, so that multiple power modules are respectively connectable to each other in fluid-tight fashion using the plug-in connections.

2. The power module as recited in claim 1, wherein the power semiconductors are semiconductor switches, a first power connection of each of the power semiconductors is connected directly to a corresponding on of the DC busbars and a second power connection of the power semiconductors being connected via a spacer to a corresponding phase busbar of the phase busbars.

3. The power module as recited in claim 1, wherein each of the DC busbars has three cooling ducts which each run parallel to the cooling ducts of the three phase busbars.

4. The power module as recited in claim 2, wherein a first power semiconductor is disposed between a first cooling duct of a first one of the DC busbars and the cooling duct of a first phase busbar of the phase busbars, a second power semiconductor is disposed between a first cooling duct of a second DC busbar of the DC busbars and the cooling duct of the first phase busbar, a third power semiconductor is disposed between a second cooling duct of the first DC busbar and the cooling duct of a second phase busbar of the phase busbars, a fourth power semiconductor is disposed between a second cooling duct of the second DC busbar and the cooling duct of the second phase busbar, a fifth power semiconductor is disposed between a third cooling duct of the first DC busbar and the cooling duct of a third phase busbar of the phase busbars, a sixth power semiconductor is disposed between a third cooling duct of the second DC busbar and the cooling duct of the third phase busbar.

5. The power module as recited in claim 1, wherein each of the cooling ducts has a cooling geometry in an area of the power semiconductors.

6. The power module as recited in claim 5, wherein the cooling geometry includes multiple cooling pins or turbulators or projections or ribs.

7. The power module as recited in claim 1, wherein the DC busbars and the phase busbars are surrounded by a casing, while leaving the plug-in fluid connections and the plug-in electrical contact connections free.

8. The power module as recited in claim 7, wherein capacitor connections are disposed laterally on the DC busbars, are led out of the casing, and are contacted with capacitors, so that each of the capacitors is located electrically between the two DC busbars.

9. The power module as recited in claim 8, wherein control-signal connections of the power semiconductors are led out laterally from the casing and are configured to be contacted with an evaluation and control unit.

10. The power module as recited in claim 7, wherein the laterally disposed capacitor connections and the laterally disposed control-signal connections are situated in one common connection plane.

11. The power module as recited in claim 1, wherein the DC busbars and the phase busbars are 3D-printed components or punched/bent parts.

12. Power electronics for a vehicle, comprising:

an evaluation and control unit; and multiple power modules including:

two DC busbars, three phase busbars which are disposed between the two DC busbars; and

11 a plurality of power semiconductors, each of which is disposed between one of the DC busbars and one of the phase busbars, wherein the DC busbars and the phase busbars are electrically insulated from one another, and each has at least one cooling duct through which a dielectric fluid flows, wherein, at both open ends of each of the respective busbars, each of the DC busbars and the phase busbars has at least one plug-in electrical contact connection and at least one plug-in fluid connection which in each instance form a combined plug-in connection, so that multiple power modules are respectively connectable to each other in fluid-tight fashion using the plug-in connections;

wherein control-signal connections of the power semiconductors are connected electrically to the evaluation and control unit.

13. The power electronics as recited in claim 12, wherein multiple power modules, each of which forms an inverter segment, are connected to each other by plug-in connections and form one overall inverter having a higher power density.

14. A vehicle, comprising:

power electronics, including:
an evaluation and control unit; and

multiple power modules including:
two DC busbars,
three phase busbars which are disposed between the two DC busbars; and
a plurality of power semiconductors, each of which is disposed between one of the DC busbars and one of the phase busbars, wherein the DC busbars and the phase busbars are electrically insulated from one another, and each has at least one cooling duct through which a dielectric fluid flows, wherein, at both open ends of each of the respective busbars, each of the DC busbars and the phase busbars has at least one plug-in electrical contact connection and at least one plug-in fluid connection which in each instance form a combined plug-in connection, so that multiple power modules are respectively connectable to each other in fluid-tight fashion using the plug-in connections;

wherein control-signal connections of the power semiconductors are connected electrically to the evaluation and control unit; and a cooling circuit in which a dielectric fluid is conducted for cooling vehicle assemblies, the power electronics being in fluid connection with the cooling circuit via corresponding interface units.

* * * * *